(12) United States Patent
Ma

(10) Patent No.: US 9,202,558 B1
(45) Date of Patent: Dec. 1, 2015

(54) PROGRAMMING MEMORY CELLS ACCORDING TO A RANK MODULATION SCHEME

(71) Applicant: Empire Technology Development LLC, Wilmington, DE (US)

(72) Inventor: Yanjun Ma, Bellevue, WA (US)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 14/457,479

(22) Filed: Aug. 12, 2014

(51) Int. Cl.
*G11C 11/34* (2006.01)
*G11C 11/56* (2006.01)
*G11C 16/34* (2006.01)

(52) U.S. Cl.
CPC ........ *G11C 11/5628* (2013.01); *G11C 16/3459* (2013.01)

(58) Field of Classification Search
USPC .......................... 365/185.03, 185.14, 185.28
See application file for complete search history.

(56) References Cited

U.S. PATENT DOCUMENTS 8,456,919 B1 * 6/2013 Jeon et al. ................. 365/185.24
2013/0268723 A1 * 10/2013 Jiang et al. ..................... 711/103

* cited by examiner

*Primary Examiner* — Anthan Tran
(74) *Attorney, Agent, or Firm* — Turk IP Law, LLC

(57) ABSTRACT

Technologies are generally described herein for performing a pulse programming operation on memory cells. The memory cells may be programmed according to a relative ranking of a property of the memory cells. The relative ranking may correspond to a particular word to be written to the memory cells. The memory cells may be pulsed until the property corresponds to a particular relative ranking. Some examples of properties of the memory cells include, but are not limited to, threshold voltages, resistance values, or current carrying capabilities.

25 Claims, 5 Drawing Sheets

PROGRAMMING MEMORY CELLS ACCORDING TO A RANK MODULATION SCHEME

BACKGROUND

Unless otherwise indicated herein, the materials described in this section are not prior art to the claims of this application and are not admitted to be prior art by inclusion in this section.

Binary values may be stored in a memory. In some memory systems, binary data may be stored in an unencoded form or stored in an encoded form. Some memory systems may utilize multi-level cell ("MLC") memories, wherein the cells are capable of being programmed in multiple states. For example, a cell in an MLC may be a four level memory cell capable of being programmed to four distinct states and hence store multiple different data values in the same cell. In some configurations, the state may be measured, or otherwise determined, by the resistance level or the threshold voltage of the cell. A threshold voltage may be the amount of voltage that causes the cell to turn on or off, depending on the particular configuration of the cell. In some configurations, it may be a challenge to encode data to be written to an MLC.

SUMMARY

In one example, a method to pulse program multi-level memory cells using a rank modulation scheme is described. The method may include receiving a relative ranking that corresponds to input data to which to program a plurality of memory cells, identifying the plurality of memory cells to program according to the relative ranking, and determining a memory cell of the plurality of memory cells corresponding to a lowest ranking of the relative ranking.

The method may include eliminating the memory cell of the plurality of memory cells corresponding to the lowest ranking from a pulse programming operation, resulting in a remaining set of memory cells of the plurality of memory cells that are to be programmed according to the pulse programming operation, and conducting the pulse programming operation on the remaining set of memory cells. The pulse programming operation may include identifying a next memory cell of the remaining set of memory cells to be programmed corresponding to a next relative ranking, and determining if the next memory cell has a relatively higher rank than a just prior eliminated memory cell.

In response to determining that the next memory cell does not have a relatively higher rank than the just prior eliminated memory cell, the pulse programming operation may include pulsing the remaining set of memory cells. In response to determining that the next memory cell has a relatively higher rank than the just prior eliminated memory cell, the pulse programming operation may include eliminating the next memory cell from an additional pulse programming operation.

In another example, an apparatus is described. The apparatus may include a flash array comprised of multilevel memory cells and a memory controller coupled to the flash array. The memory controller may be configured to pulse program the multilevel memory cells by identification of the memory multilevel cells to program according to a relative ranking of threshold voltages, corresponding to input data, to which to program the multilevel memory cells. The memory controller may be configured to pulse program by elimination of a memory cell of the multilevel memory cells corresponding to a lowest ranking of the relative ranking of threshold voltages, which results in availability of a remaining set of memory cells of the multilevel memory cells to which to program according to the relative ranking of threshold voltages and by use of a pulse programming operation. The memory controller may be configured to pulse program the multilevel memory cells by application of the pulse programming operation on the remaining set of memory cells.

The pulse programming operation may include an identification of a next memory cell of the remaining set of memory cells to be programmed corresponding to a next relative ranking of the threshold voltages, and a determination of a difference in threshold voltage between the next memory cell and a just prior eliminated memory cell of the memory cells to determine if the next memory cell has a relatively higher threshold voltage than the just prior eliminated memory cell.

In response to determination that the next memory cell does not have a relatively higher threshold voltage than the just prior eliminated memory cell, the pulse programming operation may include pulse of the remaining set of memory cells. In response to determination that the next memory cell has a relatively higher threshold voltage than the just prior eliminated memory cell, the pulse programming operation may include elimination of the next memory cell from an additional pulse programming operation.

In another example, a system is described. The system may include a binary encoder and a programming control module. The binary encoder may be operative to receive binary data to be written to a plurality of memory cells in a flash array, and receive a relative ranking of memory cells corresponding to the binary data to be written to a flash array.

The programming control module may be coupled to the binary encoder and may be operative to receive, from the binary encoder, the relative ranking of memory cells corresponding to the binary data to be written to the flash array, and identify the plurality of memory cells to program according to the relative ranking of memory cells. The relative ranking may be representative of the threshold voltages of the memory cells.

The programming control module may be operative to conduct a programming operation on the plurality of memory cells. The programming operation may include identification of a first memory cell and a second memory cell of the plurality of memory cells to be programmed, the first memory cell corresponding to a relatively lower ranking of the threshold voltages and the second memory cell corresponding to a next relatively higher ranking of the threshold voltages.

In response to a determination that the second memory cell has a relatively lower threshold voltage than the first memory cell, the programming operation may include application of a voltage to the second memory cell and other cells in plurality of memory cells with the exception of the first memory cell. In response to a determination that the second memory cell has a relatively higher threshold voltage than the first memory cell, the programming operation may include elimination of the second memory cell from an additional programming operation. In response to a determination that there are other cells in the plurality of memory cells to be programmed, the programming operation may include performance of the programming operation on the other cells. In response to a determination there are no other cells in the plurality of memory cells to be programmed, the programming operation may include termination of the programming operation.

The foregoing Summary is illustrative only and is not intended to be in any way limiting. In addition to the illustrative aspects, embodiments, and features described above, further aspects, embodiments, and features will become apparent by reference to the Figures and the following Detailed Description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
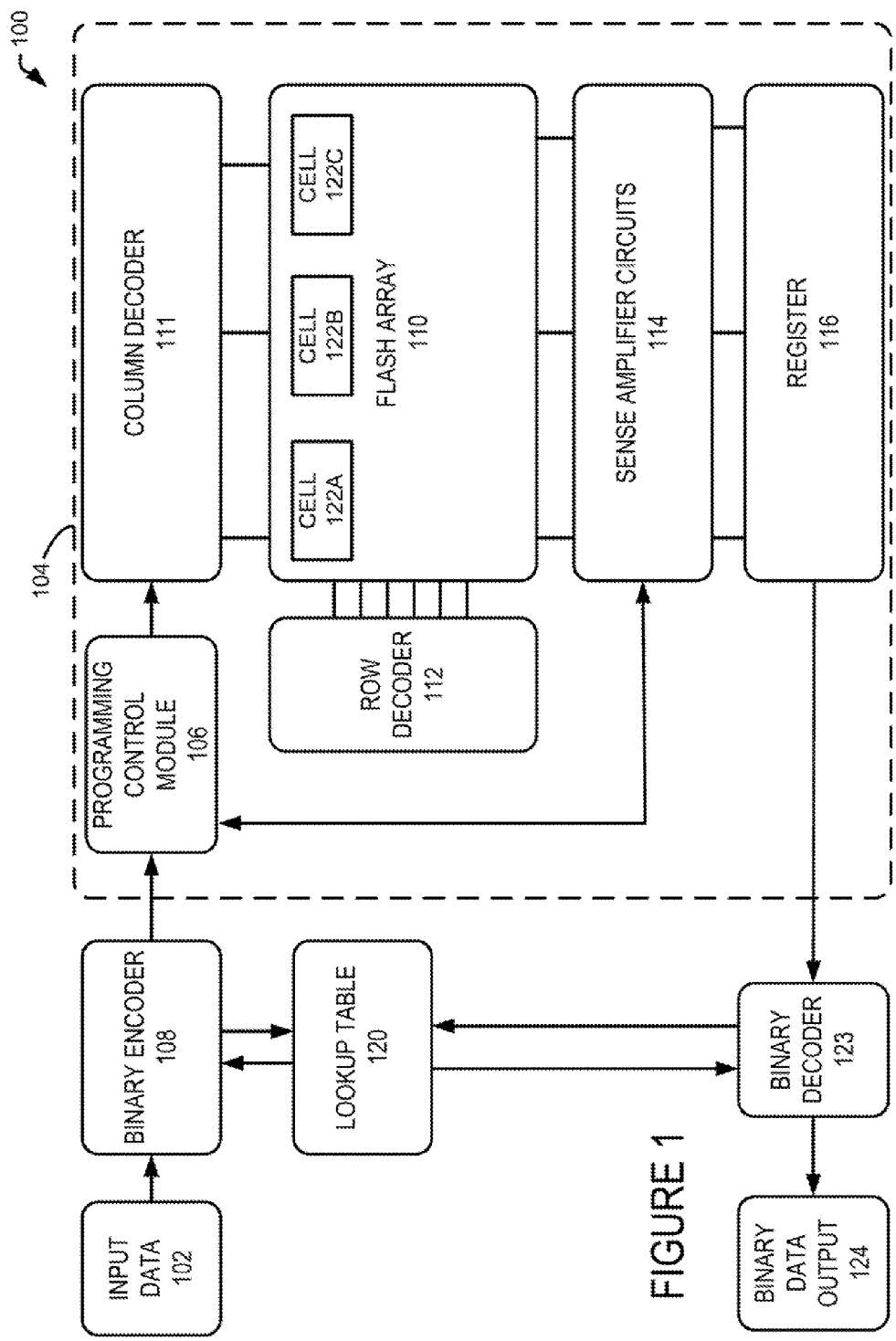
FIG. 1 is an illustration of a system operative to write binary data according to a rank modulation scheme.

In the following detailed description, reference is made to the accompanying drawings, which form a part hereof. In the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein.

The aspects of the present disclosure, as generally described herein, and illustrated in the figures, can be arranged, substituted, combined, separated, and designed in a wide variety of different configurations, all of which are explicitly contemplated herein. Further, one or more components of various figures described below may not be included in the figure for purposes of clarity or brevity. This should not be construed as a disclaimer or admission that the non-included components do not form part of the subject matter described herein.

This disclosure is generally drawn, inter alia, to pulse programming two or more memory cells in a memory array according to a rank modulation scheme. In some configurations, input data (e.g., binary data) to be written to the memory cells is received by a memory system. A memory system may use a lookup table to encode the binary data into a rank modulation scheme. The encoding may produce a relative ranking of threshold voltages of the memory cells. The relative ranking of the threshold voltages may represent the binary data to be written. In some examples, a relative ranking may include, but is not limited to, properties such as resistance values or current carrying capabilities of memory cells. These and other properties, when ranked, may be used to represent binary data.

As used herein, the phrase "relative ranking of the threshold voltages" may refer to the order of the threshold voltages of each memory cell in relation to each of the other memory cells. For example, a two memory cell relative ranking of the threshold voltages may be represented by a first memory cell having a relatively lower threshold voltage than a threshold voltage of a second memory cell. In some configurations, the actual threshold voltage of the memory cells may not be known, as the information of concern may be the comparison of the relative threshold voltages. The memory cells may be programmed according to the relative ranking.

In some examples, the memory cells may be programmed using a pulse programming operation. The pulse programming operation may be used to adjust the threshold voltage of one or more of the memory cells. For example, the threshold voltages might be adjusted to modify the original relative ranking of threshold voltages to a desired/particular relative ranking of threshold voltages. As used herein, the term "pulse" or "pulse operation" may refer to a modification of the threshold voltage of a transistor in a particular memory cell. In other examples, a pulse or pulse operation may refer to an action performed on one or more memory cells that changes a property of the memory cell, such as the threshold voltage, the resistance value, or the current carrying capabilities of the memory cell.

In some configurations, memory cells may be programmed using an individual pulse operation. For example, a first memory cell may be established as the memory cell with the lowest threshold voltage. The memory cell to have the next higher relative ranking of threshold voltage may be pulsed until the threshold voltage is greater than that of the memory cell with the previously identified lower threshold voltage. This pulse process may be continued for each of the remaining memory cells until the memory cells are programmed according to the relative ranking received from the lookup table. In other configurations, two or more memory cells may be pulsed together in a collective pulse operation. In this configuration, when pulsing one memory cell to cause the memory cell to have a relatively higher threshold voltage, other memory cells might also be pulsed at the same time to increase their threshold voltage. These and other example aspects are described in additional detail in the following figures.

FIG. 1 is an illustration of system 100 operative to write input data 102 according to a rank modulation scheme, arranged according to at least some embodiments presented herein. The input data 102 is an example of input data that may be written to a memory apparatus 104. In some implementations, the input data 102 may be in rank modulation format when received by the system 100. The memory apparatus 104 may include a programming control module 106 coupled to a binary encoder 108. The programming control module 106 may be further coupled to a flash array 110 or other array of memory cells, such as memory cells 122A, 122B, 122C, and the like. The flash array 110 may be coupled to the programming control module 106, a column decoder 111, a row decoder 112, and sense amplifier circuits 114. The sense amplifier circuits 114 may be coupled to a register 116. The register 116 may be coupled to a binary decoder 123. The binary decoder 123 may provide a data output 124. In some implementations, the input data 102 may include redundancy data or error correction codes that may be used to perform an error correction of the input data 102. In some configurations the error correction code, or other data that may be used to perform error correction, may be generated by the programming control module 106 or other components.

In operation, the binary encoder 108 may receive the input data 102 to be written to the flash array 110. The binary encoder 108 may access a lookup table 120 or other type of data structure or hardware/software element that includes or otherwise maintains/stores a relative ranking of cells. The lookup table 120 may include a relative ranking of cells corresponding to the particular data to be written to the flash array 110. For example, in a three cell system, e.g. the input data 102 comprises three bits with each bit to be written to a respective memory cell in the flash array 110. In this example, the lookup table 120 may comprise the example information found in Table 1. It should be appreciated that the information provided in Table 1 is illustrative only.

TABLE 1

EXAMPLE RELATIVE RANKING

| BINARY DATA | RELATIVE CELL RANKING |
|---|---|
| 000 | Cell 1: Lowest Relative Threshold Voltage; Cell 2: Middle Relative Threshold Voltage; and Cell 3: Highest Relative Threshold Voltage. |
| 001 | Cell 1: Highest Relative Threshold Voltage; Cell 2: Lowest Relative Threshold Voltage; and Cell 3: Middle Relative Threshold Voltage. |
| 111 | Cell 1: Middle Relative Threshold Voltage; Cell 2: Lowest Relative Threshold Voltage; and Cell 3: Highest Relative Threshold Voltage. |

As shown above in TABLE 1, if the input data 102 comprises the word, "000," the relative ranking of the memory cells to which the word is written is memory cell 1 with the lowest relative threshold voltage, memory cell 2 with the middle relative threshold voltage, and memory cell 3 with the highest relative threshold voltage, as compared to the other two memory cells. In another example, the input data 102 for the word "001" corresponds to memory cell 1 with the highest relative threshold voltage, memory cell 2 with the lowest relative threshold voltage, and memory cell 3 with the middle relative threshold voltage, as compared to the other two memory cells. The relative ranking of the memory cells may vary from implementation to implementation depending on the particular encoding which associates the relative ranking with a particular word. In some implementations, the ranking of the memory cells may be according to, among other possibilities, resistance values, magnetic values, or current carrying capabilities of the memory cells. The binary encoder 108 may be configured to provide the encoding for the input data 102 according to the relative ranking of threshold voltages received from the lookup table 120.

It should be noted that, in some implementations, the number of cells to be programmed may not be equal to the number of bits in the word to be encoded. In some implementations, the number of cells to be programmed is at least equal to the number of possible permutations of words to be encoded. For example, a four cell system may be used to encode two bit words. In another example, an eight cell system may be used for encoding three bit words. In other implementations, the number of cells capable of being programmed may be less than or greater than the possible number of permutations. For example, a four cell system may be used to encode five bit words.

The programming control module 106 may be configured to receive the relative ranking of threshold voltages from the binary encoder 108 and may condition the memory cells of the flash array 110 to which the now-encoded input data 102 may be written by performing a pulse operation on the memory cells. In conjunction with the row decoder 112, the column decoder 111, and the programming control module 106 may identify the row and column for each of the memory cells of the flash array 110.

The programming control module 106 may then condition the identified memory cells so the relative threshold voltages of the three identified memory cells are set to the relative ranking of threshold voltages received from the binary encoder 108. The programming control module 106 may compute the address of the memory cells to be pulsed. For example, the programming control module 106 may bitwise (or binary) AND the logic address of all the memory cells to be pulsed to obtain the column address of the cells to be pulsed.

In an example operation, the programming control module 106 may be instructed by the binary encoder 108 and/or other element to write the relative ranking corresponding to the word, "111" of Table 1, as provided above, to cell 122A ("cell 1"), cell 122B ("cell 2"), and cell 122 C ("cell 3"). The input data 102 for the word "111" corresponds to cell 122A with the middle relative threshold voltage, cell 122B with the lowest relative threshold voltage, and cell 122C with the highest relative threshold voltage, as compared to the other two memory cells.

In some configurations, the cells 122A, 122B, and 122C may each have a low or "0" threshold voltage. This may occur if an erase operation is performed on the cells. In these configurations, the programming control module 106 may be configured to eliminate cell 122B from programming since cell 122B may already be at a low threshold voltage. The programming control module 106 may pulse cell 122A until the cell 122A is at a higher relative threshold voltage than cell 122B. The programming control module may thereafter pulse cell 122C until the cell 122C has a relatively higher threshold voltage than the cell 122A. The result of the pulsing operation(s) may provide the rank modulation corresponding to the relative ranking of threshold voltages. The relative ranking of the memory cells may be determined by the sense amplifier circuits 114 and associated logic circuits.

In other configurations, the relative value of the threshold voltages of the cells 122A, 122B, and 122C may not be set to a same or similar value. The cells 122A, 122B, and 122C may have been previously programmed with a different relative ranking than is desired according to the value provided in the lookup table 120. In these configurations, the programming control module 106 may program the cells to achieve the determined relative ranking of threshold voltages. In some examples, the programming control module 106 may determine the cell corresponding to the lowest ranking and eliminate that cell from programming. The elimination of a cell from programming may involve not pulsing that particular cell. Thus, the gate potential of the cell may not be changed, and the cell's threshold voltage may not be changed. This procedure might be used since the other cells to be programmed may already have a threshold voltage above the lowest ranked cell. Therefore, there may be no reason to program the lowest ranked cell.

In one example, the programming control module 106 may be instructed by the binary encoder 108 and/or by some other element to write the relative ranking corresponding to the word, "111" of Table 1, as provided above, to cell 122A ("cell 1"), cell 122B ("cell 2"), and cell 122 C ("cell 3"). The input data 102 for the word "111" corresponds to cell 122A with the middle relative threshold voltage, cell 122B with the lowest relative threshold voltage, and cell 122C with the highest relative threshold voltage, as compared to the other two memory cells.

In this example, as an initial starting point, cell 122A may have the lowest relative threshold voltage, cell 122B may have the middle relative threshold voltage, and cell 122C may have the highest relative threshold voltage. Thus, the relative ranking of threshold voltages is to be reconfigured from A<B<C to B<A<C. The programming control module 106 may be configured to determine that cell 122B is the lowest ranked cell for the relative ranking corresponding to the word, "111." Thus, the programming control module 106 may eliminate cell 122B from programming.

The programming control module 106 may pulse the cell 122A and the cell 122C to raise the threshold voltage for each of the cells. Since the cell 122A is the next cell of higher ranking, the programming control module 106, or another component, may determine the relative threshold voltage between the cell 122A and the cell 122B. This measurement may be used by the programming control module 106, or another component, to determine whether the threshold voltage of the cell 122A has increased above the threshold voltage of the cell 122B. If the threshold voltage is not greater, the programming control module 106 may re-pulse the cell 122A and the cell 122C. This procedure may comprise at least some of the operations of "incremental step pulse programming" in one embodiment. The pulsing operations may continue until the threshold voltage of the cell 122A is greater than the potential of the cell 122B.

The programming control module 106 may also be configured to measure or otherwise determine the relative threshold voltage between the cell 122A and the cell 122C. When the threshold voltage of the cell 122C is not greater than the cell 122A, the programming control module 106 may be configured to perform the incremental step pulse programming procedure in a similar manner as described above.

Figure 5:
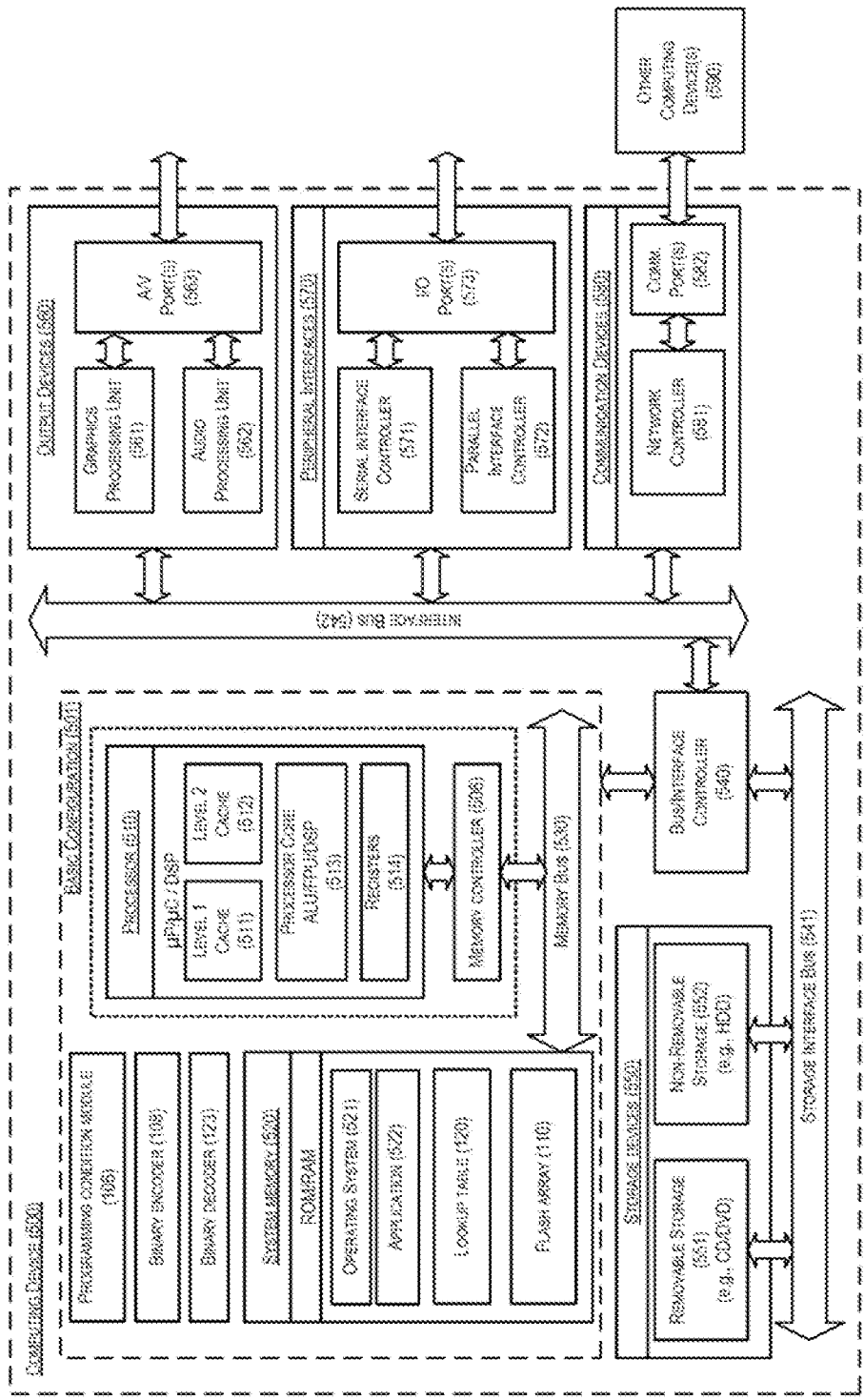
FIG. 5 is a block diagram illustrating an example computing device that is arranged to implement technologies to pulse program a plurality of multi-level memory cells using a rank modulation scheme, all arranged according to at least some embodiments presented herein.

When reading the cell 122A, the cell 122B, and the cell 122C, a memory controller, such as the memory controller 506 of FIG. 5, may cause or otherwise control the sense amplifier circuits 114 to sense the threshold voltages of the cell 122A, the cell 122B, and the cell 122C. The binary decoder 123 and sense amplifier circuits 114 may determine the relative difference or relative ranking between the threshold voltages of the cell 122A, the cell 122B, and the cell 122C. The programming control module 106 may also perform a validation operation to confirm that the cell 122A, the cell 122B, and the cell 122C are programmed in accordance with the relative ranking of threshold voltages.

In some examples, the sense amplifier circuits 114 and programming control module 106 may be configured to compare the relative ranking of the cells under programming to the desired relative ranking. In some configurations, the register 116 may be a memory data register that receives data from the sense amplifier circuits. The register 116 may output the data to the binary decoder 123. The binary decoder 123 may receive the output from the output from the register 116 and access the lookup table 120 to translate the determined relative rankings as the data output 124. The binary decoder 123 may also be used (alternatively or additionally to the programming control module 106) to verify the relative rankings as the memory cells are undergoing programming by verifying a pulse programming operation as the pulse programming operation is proceeding.

In some configurations, the relative threshold voltages of the cells undergoing incremental step pulse programming may not be measured. In some examples, the behavior of the cells may be well known. In these and other examples, it may be assumed that threshold voltages of the cells may increase at a known amount for a known number of pulses. For example, if it is known that the threshold voltage of the cells increase by +1 mV per pulse, then the programming control module 106 may determine initial threshold voltages and count the number of pulses applied to achieve desired particular relative ranking. Various aspects of the processes described above are illustrated in further detail in the figures below. It should be noted that the above description programs the memory cell in the order of low rank to high rank. Alternative, for some types of memory cells, it may be more convenient to program the cells in the order of high to low.

Figure 2:
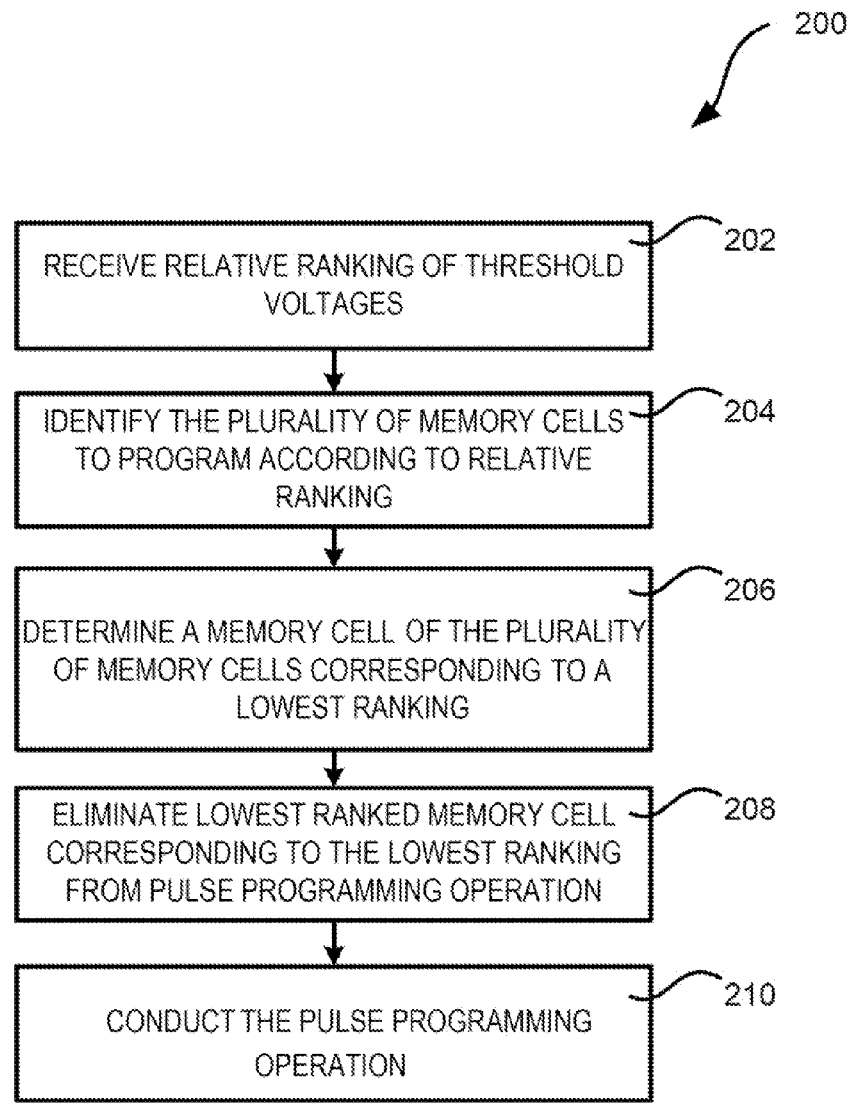
FIG. 2 is a flow diagram illustrating an example process to pulse program a plurality of multi-level memory cells using a rank modulation scheme.

FIG. 2 is a flow diagram illustrating an example process to pulse program a plurality of multi-level memory cells using a rank modulation scheme according to at least some embodiments presented herein. The operations of any process described herein are not necessarily presented in any particular order and performance of some or all of the operations in an alternative order(s) is possible and is contemplated. The operations have been presented in the demonstrated order for ease of description and illustration. Operations may be added, combined, modified, omitted, and/or performed simultaneously, in a different order, etc., without departing from the scope of the present disclosure.

The illustrated processes can be ended at any time and need not be performed in its entirety. Some or all operations of the processes, and/or substantially equivalent operations, can be performed in one embodiment by execution of computer-readable instructions included on a computer storage media, as disclosed herein, including a tangible non-transitory computer-readable storage medium. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, or the like. For purposes of illustrating and describing at least one embodiment of the present disclosure, the process 200 is described as being performed, at least in part, by the binary encoder 108, the programming control module 106, and the binary decoder 123 (which in turn may operate in conjunction with a processor, such as the processor 510 of FIG. 5). This embodiment is illustrative, and the process 200, or other processed illustrated herein, may be performed in other ways.

The process 200 may begin at block 202 ("receive relative ranking of threshold voltages"), where a relative ranking of threshold voltages may be received. In one configuration, the relative ranking of threshold voltages is received at the binary encoder 108 from the lookup table 120 and/or from some other source(s). The binary encoder 108 may receive input data, such as the input data 102, to be written to the flash array 110.

The input data 102 may be received from an operation that places the data on a memory bus, such as memory bus 530 of FIG. 5. In some examples, a processor, such as processor 510 of FIG. 5, may perform an operation that generates the input data 102. The processor 510 may be coupled to a memory controller 506 of FIG. 5. The memory controller 506 may be coupled to the flash array 110. The memory controller 506 may receive instructions from the processor to write the data to the flash array 110. Other scenarios are possible, where the input data 102 is provided so as to be written into the flash array 110.

The binary encoder 108 may receive an instruction from the memory controller 506 to encode the binary data according to a relative ranking of threshold voltages. The binary encoder 108 may query the lookup table 120, which may be stored in a storage device, such as a system memory 520 shown in FIG. 5 below and/or other storage location(s). The binary encoder 108 may receive the relative ranking from the lookup table 120 and provide the relative ranking to the programming control module 106.

The process 200 may continue to block 204 ("identify the plurality of memory cells to program according to the relative ranking"), where the programming control module 106 may receive an identity of the memory cells to program. The identity of the memory cells may be provided by the memory controller 506 or another component. For example, cells 122A, 122B, and 122C may be identified as the cells to program the word, "111."

The process 200 may continue to block 206 ("determine a memory cell of the plurality of memory cells corresponding to a lowest ranking"), where a memory cell of the plurality of memory cells corresponding to the lowest ranking of threshold voltages of the relative ranking of threshold voltages may be determined by the programming control module 106. In some configurations, the number of pulsing operations may be reduced by first identifying the lowest ranked memory cell. During a pulse programming operation (described in further detail below), the threshold voltages of the other memory cells may be increased above the lowest ranked memory cell. Thus, in some configurations, the lowest ranking memory cell may not need to be pulse programmed or otherwise have its voltage changed.

Continuing with the example provided above, the cells 122A, 122B, and 122C, may have been identified as the cells to which the word "111" is to be written. According to example Table 1 described above, the cell 122B is to have the lowest relative potential. Thus, in this example, the cell 122B may be the cell determined to correspond to the lowest ranking of the relative ranking of threshold voltages.

The process 200 may continue to block 208 ("eliminate lowest ranked memory cell corresponding to the lowest ranking from pulse programming operation"), where the memory cell identified in block 206 may be eliminated from the pulse programming operation. Furthering the example provided above, the cell 122B, which was previously determined to correspond to the lowest ranking of the relative ranking of threshold voltages, may be eliminated by the programming control module 106 from the pulse programming operation. As noted above, because the cell is to be the lowest ranked cell, the other memory cell threshold voltages may be increased to be above that of the lowest ranked cell. In some cases, since the lowest ranked cell may have the lowest threshold voltage, it need not be programmed in one embodiment. The elimination of the lowest ranked cell from the pulse programming operation may generate a remaining set of memory cells of the plurality of memory cells to be programmed according to the pulse programming operation.

The process 200 may continue to block 210 ("conduct the pulse programming operation"), where the pulse programming operation may be conducted by the programming control module 106 on the remaining set of memory cells. In one configuration, the pulse programming operation may be an incremental pulse programming operation where one or more of the memory cells of the remaining set of memory cells receive a pulse to increase the threshold voltage of the memory cell, such as illustrated in FIG. 3.

Figure 3:
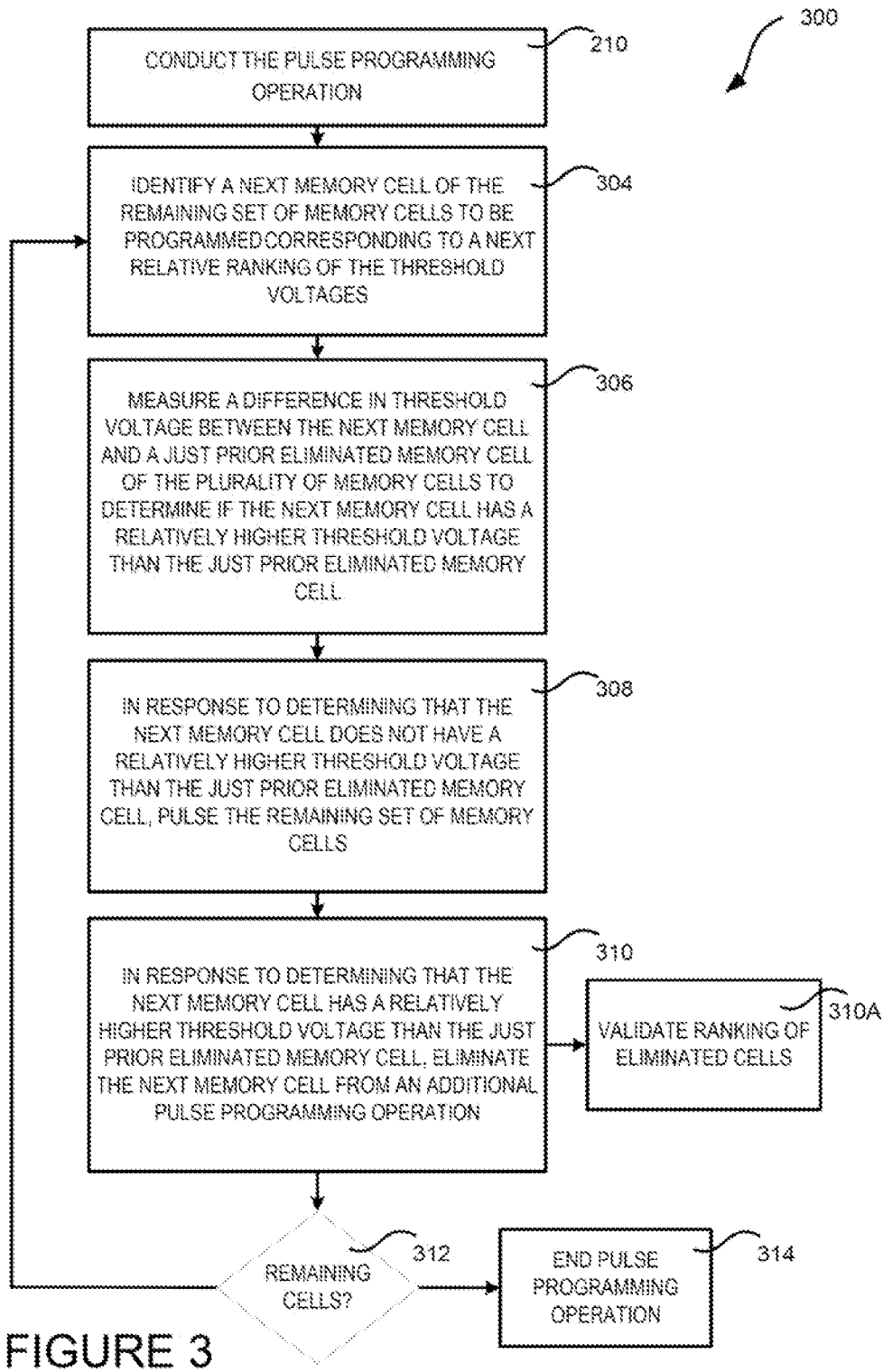
FIG. 3 is a flow diagram of an example pulse programming operation.

FIG. 3 is a flow diagram of an example pulse programming operation arranged according to at least some embodiments presented herein. The process 200 illustrated in FIG. 2 may continue to process 300, where a pulse programming operation is conducted. In furtherance of the continuing example, the remaining set of memory cells includes the cell 122A and the cell 122C. As noted above, in this example, because the cell 122B is the lowest ranked cell, the cell 122B may be eliminated from the pulse programming operation.

The process 300 may continue from block 210 from FIG. 2, to block 304 ("identify a next memory cell of the remaining set of memory cells to be programmed corresponding to a next relative ranking of the threshold voltages"), where a next memory cell of the remaining set of memory cells to be programmed corresponding to a next relative ranking of the threshold voltages may be identified by the programming control module 106. In the present example, the cell 122A is listed in Table 1 as the middle relative threshold voltage cell, and thus, may be the next memory cell of the remaining set of memory cells that corresponds to a next relative ranking of the threshold voltages.

The process 300 may continue to block 306 ("measure a difference in threshold voltage between the next memory cell and a just prior eliminated memory cell of the plurality of memory cells to determine if the next memory cell has a relatively higher threshold voltage than the just prior eliminated memory cell"), where the programming control module 106 may determine a difference in threshold voltage between the next memory cell and a just prior eliminated memory cell of the plurality of memory cells. The measurement may be used to determine if the next memory cell has a relatively higher threshold voltage than the just prior eliminated memory cell.

Block 306 may be performed by the programming control module 106 to determine if the next cell to be programmed has a relatively higher threshold voltage than a previously eliminated cell. In the present example, the relative difference between the threshold voltage of the cell 122A and the cell 122B may be measured or otherwise determined.

The process 300 may continue to block 308 ("in response to determining that the next memory cell does not have a relatively higher threshold voltage than the just prior eliminated memory cell, pulse the remaining set of memory cells"), where in response to determining that the next memory cell does not have a relatively higher threshold voltage than the just prior eliminated memory cell, the programming control module 106 may pulse or otherwise change the voltage of the remaining set of memory cells. In the present example, the cell 122A and the cell 122C are pulsed.

The process 300 may continue to block 310 ("in response to determining that the next memory cell has a relatively higher threshold voltage than the just prior eliminated memory cell, eliminate the next memory cell from an additional pulse programming operation"), where in response to determining that the next memory cell has a relatively higher threshold voltage than the just prior eliminated memory cell, the programming control module 106 may eliminate the next memory cell from an additional pulse programming operation. Thus, in the present example, if the cell 122A (the next memory cell) is measured to have a relatively higher threshold voltage than the cell 122B (the just prior eliminated memory cell), the programming for the cell 122A may be considered complete and the cell 122A may be eliminated from the pulse programming operation.

In some configurations, the process 300 may continue to block 310A ("validate ranking of eliminated cells"), where the ranking of the eliminated cells may be validated. The validation may be performed to confirm that the eliminated memory cells are programmed in accordance with the relative ranking of the threshold voltages. Various components may perform the validation including, but not limited to, the binary decoder 123 of FIG. 1. The validation operation in block 310A may be performed for various reasons. For example, the validation may be performed to ensure that the pulse programming operation is continuing as intended. In operations on a relatively large number of memory cells, if the pulse programming operation is not validated, and a relative ranking is incorrect, there may be significant overhead to either program another set of memory cells or re-program the current set of memory cells.

The process 300 may continue to block 312 ("remaining cells?"), where a determination may be made by the programming control module 106 as to whether or not any additional cells are to be programmed. If there are no more memory cells to be programmed, the process 300 may continue to block 314 ("end pulse programming operation"), where the pulse programming operation may be ended. If there are additional cells to be programmed, the process 300 may continue to block 304 ("identify a next memory cell of the remaining set of memory cells to be programmed corresponding to a next relative ranking of the threshold voltages"), where the next memory cell to be programmed is identified. In the present example, the next memory cell may be the cell 122C. The process 300 may continue until there are no more cells remaining to be programmed.

Figure 4:
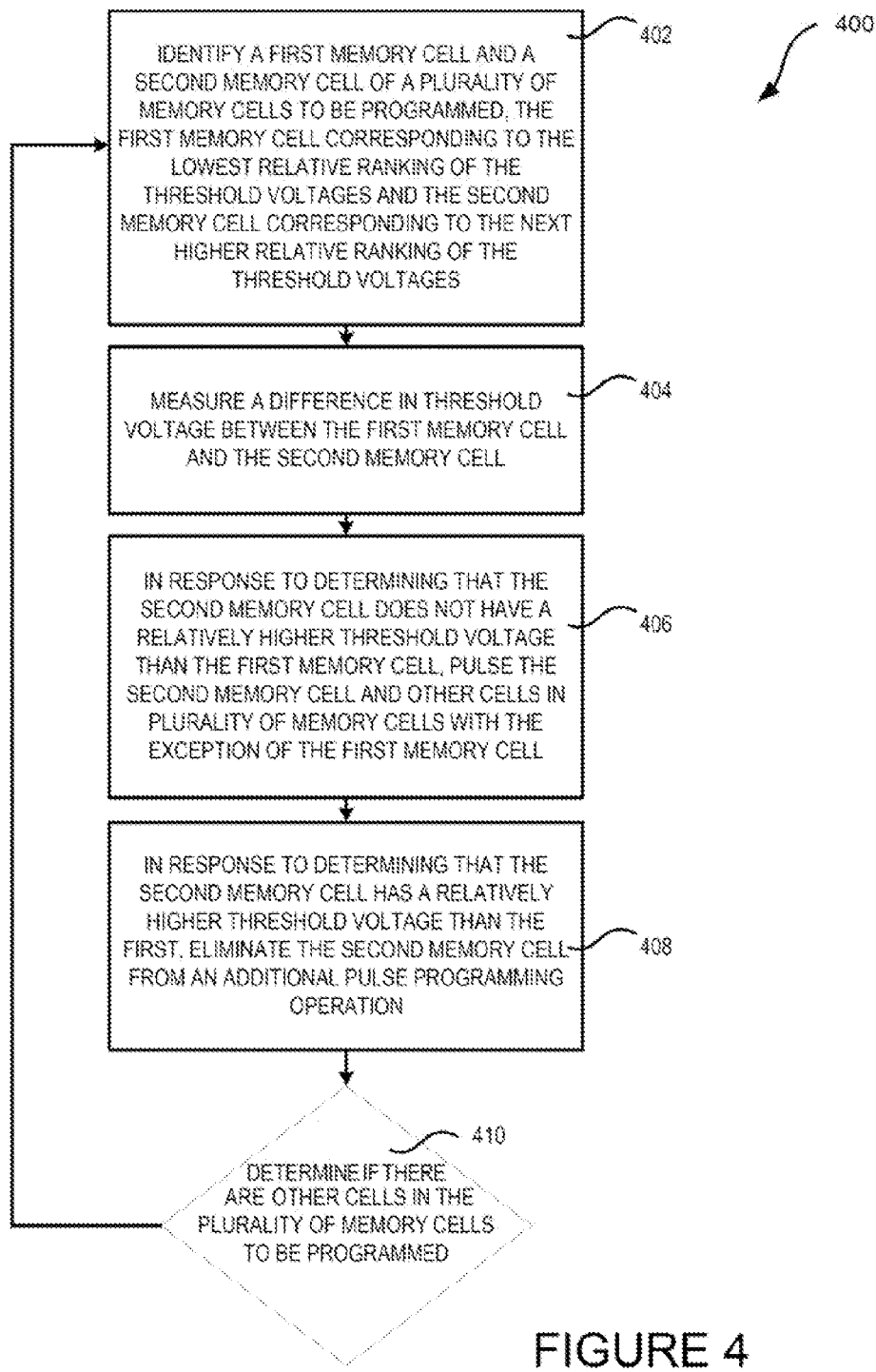
FIG. 4 is a flow diagram of another process to conduct a pulse programming operation.

FIG. 4 is a flow diagram of another process 400 to conduct a pulse programming operation, arranged according to at least some embodiments presented herein. The process 400 may commence at block 402 ("identify a first memory cell and a second memory cell of a plurality of memory cells to be programmed, the first memory cell corresponding to the lowest relative ranking of the threshold voltages and the second memory cell corresponding to the next higher relative ranking of the threshold voltages"), where a first memory cell and a second memory cell of a plurality of memory cells are to be programmed. The first memory cell may correspond to the lowest relative ranking of the threshold voltages and the second memory cell may correspond to the next higher relative ranking of the threshold voltages are identified. The identification operation of block 402 may be performed by the programming control module 106.

The process 400 may continue to block 404 ("measure a difference in threshold voltage between the first memory cell and the second memory cell"), where the programming control module 106 may determine a difference in threshold voltage between the first memory cell and the second memory cell.

The process 400 may continue to block 406 ("in response to determining that the second memory cell does not have a relatively higher threshold voltage than the first memory cell, pulse the second memory cell and other cells in plurality of memory cells with the exception of the first memory cell"), where in response to determining that the second memory cell does not have a relatively higher threshold voltage than the first memory cell, the second memory cell and other cells in plurality of memory cells with the exception of the first memory cell may be pulsed by the programming control module 106.

The process 400 may continue to block 408 ("in response to determining that the second memory cell has a relatively higher threshold voltage than the first, eliminate the second memory cell from an additional pulse programming operation"), where in response to determining that the second memory cell has a relatively higher threshold voltage than the first, the programming control module 106 may eliminate the second memory cell from an additional pulse programming operation.

The process 400 may continue to block 410 ("determine if there are other cells in the plurality of memory cells to be programmed"), where a determination may be made by the programming control module 106 as to whether or not there are other cells in the plurality of memory cells to be programmed. The process may continue to block 402 or may end.

FIG. 5 is a block diagram illustrating an example computing device 500 that is arranged to implement technologies to pulse program a plurality of multi-level memory cells using a rank modulation scheme in accordance with at least some embodiments described herein. In a very basic configuration 501, computing device 500 typically includes one or more processors 510 and a system memory 520. A memory bus 530 can be used for communicating between the processor 510 and the system memory 520.

Depending on the desired configuration, processor 510 can be of any type including but not limited to a microprocessor ("µP"), a microcontroller ("µC"), a digital signal processor ("DSP"), or any combination thereof. Processor 510 can include one more levels of caching, such as a level one cache 511 and a level two cache 512, a processor core 513, and registers 514. The processor core 513 can include an arithmetic logic unit ("ALU"), a floating point unit ("FPU"), a digital signal processing core ("DSP Core"), or any combination thereof. The memory controller 506 can also be used with the processor 510, or in some implementations the memory controller 506 can be an internal part of the processor 510. The processor 510 can be a multi-core processor having two or more independent processing units ("cores").

Depending on the desired configuration, the system memory 520 can be of any type including but not limited to volatile memory (such as RAM), nonvolatile memory (such as ROM, flash memory, etc.) or any combination thereof. System memory 520 typically includes an operating system 521 and one or more applications 522 (as well as data for the application 522). The system memory 520 may include/store or be coupled to the lookup table 120. The flash array 110 may comprise part of the system memory 520 and/or may comprise part of some other storage device of the computing device 500. The programming control module 106 may be coupled to the memory controller 506. The programming control module 106, the binary encoder 108, or the binary decoder 123 may be embodied as part of or operate in conjunction with the application 522 or other computer-readable instructions stored in the system memory 520 in one embodiment. In another configuration, the programming control module 106, the binary encoder 108, or the binary decoder 123 may be operatively coupled to the system memory 520 as external modules/units in the form of hardware, software, or combination thereof.

Computing device 500 can have additional features or functionality, and additional interfaces to facilitate communications between the basic configuration 501 and any required devices and interfaces. For example, a bus/interface controller 540 can be used to facilitate communications between the basic configuration 501 and one or more data storage devices 550 via a storage interface bus 541. The data storage devices 550 can be removable storage devices 551, non-removable storage devices 552, or a combination thereof. Examples of removable storage and non-removable storage devices include magnetic disk devices such as flexible disk drives and hard-disk drives ("HDD"s), optical disk drives such as compact disk ("CD") drives or digital versatile disk ("DVD") drives, solid state drives ("SSD"s), and tape drives to name a few. Example computer storage media can include volatile and nonvolatile, removable and non-removable media implemented in any method or technology for storage of information, such as computer readable instructions, data structures, program modules, or other data.

System memory 520, removable storage devices 551 and non-removable storage devices 552 are all examples of computer storage media. Computer storage media includes, but is not limited to, RAM, ROM, EEPROM, flash memory or other memory technology, CD-ROM, digital versatile disks ("DVD"s) or other optical storage, magnetic cassettes, magnetic tape, magnetic disk storage or other magnetic storage devices, or any other medium which can be used to store the desired information and which can be accessed by computing device 500. Any such computer storage media can be part of the computing device 500.

Computing device 500 can also include an interface bus 542 for facilitating communication from various interface devices (e.g., output interfaces, peripheral interfaces, and communication interfaces) to the basic configuration 501 via the bus/interface controller 540. Example output devices 560 include a graphics processing unit 561 and an audio processing unit 562, which can be configured to communicate to various external devices such as a display or speakers via one or more A/V ports 563. Example peripheral interfaces 570 include a serial interface controller 571 or a parallel interface controller 572, which can be configured to communicate with external devices such as input devices (e.g., keyboard, mouse, pen, voice input device, touch input device, etc.) or other peripheral devices (e.g., printer, scanner, etc.) via one or more I/O ports 573. An example communication device 580 includes a network controller 581, which can be arranged to facilitate communications with one or more other computing devices 590 over a network communication via one or more communication ports 582. The communication connection is one example of a communication media.

Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency ("RF"), infrared ("IR"), Fiber Optics, and other wireless media. The term computer readable media as used herein can include both storage media and communication media.

Computing device 500 can be implemented as a portion of a small-form factor portable (or "mobile") electronic device such as a cell phone, a personal data assistant ("PDA"), a personal media player device, a wireless web-watch device, a personal headset device, an application specific device, or a hybrid device that include any of the above functions. Computing device 500 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. This disclosure is not limited to particular methods, compounds, or compositions, which can, of course, vary. The terminology used herein is for the purpose of describing particular embodiments only, and is not intended to be limiting. Additionally, for purposes of clarity, one or more components of the circuits in the figures may not be illustrated but may be included.

Other memory access technologies and techniques may be used and are still considered to be within the scope of the present disclosure. The circuits illustrated are not limited to the components illustrated and may include more or fewer components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like is to distinguish between repeated instances of a component or a step in a process and does not impose a serial or temporal limitation unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A method to program multi-level memory cells using a rank modulation scheme, the method comprising:
   receiving input data, to which to program a plurality of memory cells;
   identifying the plurality of memory cells to program to a relative ranking according to the input data;
   determining a memory cell of the plurality of memory cells corresponding to a lowest ranking of the relative ranking;
   eliminating the memory cell of the plurality of memory cells corresponding to the lowest ranking from a pulse programming operation, resulting in a remaining set of memory cells of the plurality of memory cells that are to be programmed according to the pulse programming operation; and
   conducting the pulse programming operation on the remaining set of memory cells, the pulse programming operation comprising
      identifying a next memory cell of the remaining set of memory cells to be programmed corresponding to a next relative ranking,
      determining if the next memory cell has a relatively higher rank than a just prior eliminated memory cell,
      in response to determining that the next memory cell does not have a relatively higher rank than the just prior eliminated memory cell, pulsing the remaining set of memory cells, and
      in response to determining that the next memory cell has a relatively higher rank than the just prior eliminated memory cell, eliminating the next memory cell from an additional pulse programming operation.

2. The method of claim 1, wherein the ranking is by a threshold voltage of the plurality of memory cells, resistance values of the plurality of memory cells, or current carrying capabilities of the plurality of memory cells.

3. The method of claim 1, wherein receiving the input data includes receiving input data that comprises redundancy data or error correction codes to provide for error correction of the input data.

4. The method of claim 1, wherein identifying the next memory cell of the remaining set of memory cells to be programmed includes performing a binary AND operation.

5. The method of claim 1, wherein:
   receiving the input data includes receiving the input data to encode in the rank modulation scheme; and the method further comprises:
   looking up the input data in a lookup table, the lookup table comprising a plurality of relative rankings, each of the plurality of relative rankings corresponding to a particular input data.

6. The method of claim 1, wherein the pulse programming operation further comprises:
   determining whether the next cell corresponds to a highest rank of the relative ranking;
   in response to determining that the next cell corresponds to the highest rank of the relative ranking, stopping the pulse programming operation; and
   in response to determining that the next cell does not correspond to the highest rank of the relative ranking, continuing the pulse programming operation.

7. The method of claim 6, further comprising verifying programmed memory cells of the plurality of memory cells.

8. The method of claim 1, further comprising validating a ranking of eliminated memory cells to confirm that the eliminated memory cells are programmed in accordance with the relative ranking in response to determining that the next memory cell has the relatively higher rank than the just prior eliminated memory cell.

9. The method of claim 1, further comprising continuing the pulse programming operation until the plurality of memory cells are in a specified ranking in accordance with the relative ranking.

10. The method of claim 1, wherein pulsing the remaining set of memory cells comprises:
    receiving a number of times to pulse the remaining set of memory cells to effectuate a change in a property of the remaining set of memory cells; and
    pulsing the remaining set of memory cells the number of times; and
    repeating the pulse programming operation.

11. The method of claim 10, wherein the property includes a threshold voltage, a resistance, or a current carrying capability of the remaining set of memory cells.

12. An apparatus, comprising:
    a flash array comprised of multilevel memory cells; and
    a memory controller coupled to the flash array, wherein the memory controller is configured to pulse program the multilevel memory cells by:
       identification of the memory multilevel cells to program according to a relative ranking of threshold voltages, corresponding to input data, to which to program the multilevel memory cells,
       elimination of a memory cell of the multilevel memory cells corresponding to a lowest ranking of the relative ranking of threshold voltages, which results in availability of a remaining set of memory cells of the multilevel memory cells to which to program according to the relative ranking of threshold voltages and by use of a pulse programming operation, and
       application of the pulse programming operation on the remaining set of memory cells, the pulse programming operation comprising:
          identification of a next memory cell of the remaining set of memory cells to be programmed corresponding to a next relative ranking of the threshold voltages, determination of a difference in threshold voltage between the next memory cell and a just prior eliminated memory cell of the memory cells to determine if the next memory cell has a relatively higher threshold voltage than the just prior eliminated memory cell, in response to determination that the next memory cell does not have a relatively higher threshold voltage than the just prior eliminated memory cell, pulse of the remaining set of memory cells, and in response to determination that the next memory cell has a relatively higher threshold voltage than the just prior eliminated memory cell, elimination of the next memory cell from an additional pulse programming operation.

13. The apparatus of claim 12, wherein the pulse programming operation further comprises:

a look up of the input data in a lookup table, the lookup table comprising a plurality of relative ranking of threshold voltages, each of the plurality of relative ranking of threshold voltages corresponding to a particular input data; and repeat of the pulse programming operation.

14. The apparatus of claim 12, wherein the pulse programming operation further comprises:

determination whether the next cell corresponds to a highest ranking of the relative ranking of threshold voltages;

in response to determination that the next cell corresponds to the highest ranking of the relative ranking of threshold voltages, stop of the pulse programming operation; and in response to determination that the next cell does not correspond to the highest ranking of the relative ranking of threshold voltages, continuance of the pulse programming operation.

15. The apparatus of claim 14, wherein the memory controller is further configured to verify programmed memory cells of the multilevel memory cells in response to determination that the next cell corresponds to the highest ranking of the relative ranking of threshold voltages.

16. The apparatus of claim 14, wherein the memory controller is further configured to validate a ranking of eliminated memory cells to confirm the eliminated memory cells are programmed in accordance with the relative ranking of threshold voltages, in response to determination that the next memory cell has the relatively higher threshold voltage than the just prior eliminated memory cell.

17. The apparatus of claim 12, wherein the memory controller is configured to continue the pulse programming operation until all of the multilevel memory cells are in a correct ranking in accordance with the relative ranking of threshold voltages.

18. The apparatus of claim 12, wherein to pulse the remaining set of memory cells, the memory controller is configured to pulse the remaining set of memory cells a number of times sufficient to effectuate a specific change in threshold voltages of the remaining set of memory cells.

19. The apparatus of claim 18, wherein the specific change in threshold voltages includes a difference in threshold voltages between at least two memory cells of the multilevel memory cells sufficient to measure the difference in threshold voltages.

20. A system configured to write binary data according to a rank modulation scheme, comprising:

a binary encoder operative to:

receive binary data to be written to a plurality of memory cells in a flash array, and receive a relative ranking of memory cells corresponding to the binary data to be written to a flash array; and a programming control module coupled to the binary encoder and operative to:

receive, from the binary encoder, the relative ranking of memory cells corresponding to the binary data to be written to the flash array, identify the plurality of memory cells to program according to the relative ranking of memory cells, the relative ranking being representative of the threshold voltages of the memory cells, and conduct a programming operation on the plurality of memory cells, the programming operation comprising:

identification of a first memory cell and a second memory cell of the plurality of memory cells to be programmed, the first memory cell corresponding to a relatively lower ranking of the threshold voltages and the second memory cell corresponding to a next relatively higher ranking of the threshold voltages, in response to a determination that the second memory cell has a relatively lower threshold voltage than the first memory cell, application of a voltage to the second memory cell and other cells in plurality of memory cells with the exception of the first memory cell, in response to a determination that the second memory cell has a relatively higher threshold voltage than the first memory cell, elimination of the second memory cell from an additional programming operation, in response to a determination that there are other cells in the plurality of memory cells to be programmed, performance of the programming operation on the other cells, and in response to a determination there are no other cells in the plurality of memory cells to be programmed, termination of the programming operation.

21. The system of claim 20, further comprising a binary decoder coupled to the flash memory and operative to perform a validation operation to confirm whether the plurality of memory cells are programmed in accordance with the relative ranking of memory cells.

22. The system of claim 20, wherein the binary decoder is operative to verify the programming operation as the programming operation proceeds.

23. The system of claim 20, wherein to conduct the programming operation, the programming control module is configured to perform an individual pulse operation or a collective pulse operation to apply at least one pulse voltage to at least one of the memory cells.

24. The system of claim 20, wherein the binary encoder is operative to access a lookup table to receive the relative ranking of memory cells.

25. The system of claim 20, further comprising a column decoder, wherein the programming control module is coupled to the binary encoder through the column decoder.

* * * * *